United States Patent [19]

Schultz

[11] 4,053,789
[45] Oct. 11, 1977

[54] TOUCH ACTUATED SYSTEM RESPONSIVE TO A COMBINATION OF RESISTANCE AND CAPACITANCE

[75] Inventor: Sheldon L. Schultz, Bloomington, Minn.

[73] Assignee: Honeywell Inc., Minneapolis, Minn.

[21] Appl. No.: 718,230

[22] Filed: Aug. 27, 1976

[51] Int. Cl.² .............................................. H01H 35/00
[52] U.S. Cl. ........................................ 307/116; 328/5; 200/DIG. 1
[58] Field of Search ..................... 307/116, 308; 328/5; 340/365 C, 258 B, 258 C; 200/DIG. 1; 361/179, 181

[56] References Cited

U.S. PATENT DOCUMENTS

| 3,200,306 | 8/1965 | Atkins et al. | 361/179 |
| 3,666,988 | 5/1972 | Bellis | 307/116 |
| 3,728,501 | 4/1973 | Larson et al. | 200/DIG. 1 |

Primary Examiner—Robert K. Schaefer
Assistant Examiner—Eugene S. Indyk
Attorney, Agent, or Firm—Alfred N. Feldman

[57] ABSTRACT

A system that is responsive to the touch of an animal, and is activated by a combination of the inherent body capacity of the animal and the application of a skin resistance to a detector means. A digital oscillator provides two pulse outputs that are compared in a pulse processing means. One of the pulse outputs is fed to a touch responsive area, that in turn is connected to the pulse processing means, a buffer amplifier and a load. The touch responsive area activates the pulse processing means whenever the touch responsive area is bridged by a resistance and at the same time a body capacitance exists to ground.

10 Claims, 3 Drawing Figures

TOUCH ACTUATED SYSTEM RESPONSIVE TO A COMBINATION OF RESISTANCE AND CAPACITANCE

BACKGROUND OF THE INVENTION

There are numerous types of electrical control systems that are responsive to the touch of animals, such as humans, pets or domestic animals. These systems vary all the way from conventional electric contact devices to capacitive and resistive type devices that respond to the proximity of an animal or the shunting of the animals body resistance across an electric circuit. These systems are usually responsive to only one condition of presence of an animal, such as capacitive coupling as in a proximity switch, or actual physical movement as in the use of a conventional electric switch. Conventional electric switches which require movements are susceptible to contamination and mechanical failures. Switches which respond to electric capacity can be inadvertently actuated by the proximity of objects other than an animal. The deficiencies of these types of switching systems are overcome by the present invention.

SUMMARY OF THE INVENTION

The present invention is directed to a reliable touch actuated system. This touch actuated system will be generally described as being responsive to the touch of an animal. It is understood that the term animal includes human beings, pets and domestic animals. The present touch actuated system relies upon the use of an oscillator or generating means which generates a pair of pulse outputs. The pair of pulse outputs are fed to a detector means that includes a touch responsive area. One of the pulse outputs is fed through an asymmetric current conducting means and resistor to one conductor of a pair of spaced electrical conductors that make up the touch responsive area. The second conductor from the touch responsive pair of conductors is fed to a pulse processing network that has been disclosed as an inverter and a flip-flop. The flip-flop receives the second of the pair of pulse outputs. The two pulse outputs are compared and are in turn fed to a load that is capable of actuating any type of electric circuitry that is desired.

The touch responsive area has been disclosed as a grid of rectangular shape with interleaved conductors. Any type of configuration which utilizes a pair of conductors that are electrically separated and which can be bridged by the touch of an animal is satisfactory. The touching of the touch responsive area accomplishes two necessary functions before the system will respond. Firstly, the pair of conductors must be bridged resistively to electrically connect the two spaced conductors. Secondly, a capacitance to ground, which is inherent in animals such as humans, pets and domestic animals is capable of being charged to a voltage supplied from a first of the pulse outputs. The simultaneous application of the bridging resistance and the charging of the inherent animal capacitance to ground causes the pulse processing means to change state, thereby indicating that the detector means has been touched and the load is then operated.

With the present system, a more reliable touch sensing mechanism is provided than is available by mere capacitive proximity type touch devices or purely resistive touch type devices. The present arrangement also has no moving parts and is therefor not subject to the contamination and spurious types of operation that might be present in systems that rely only on one electrical condition being present before the system will operate.

DESCRIPTION OF THE PREFERRED EMBODIMENT

Figure 1:
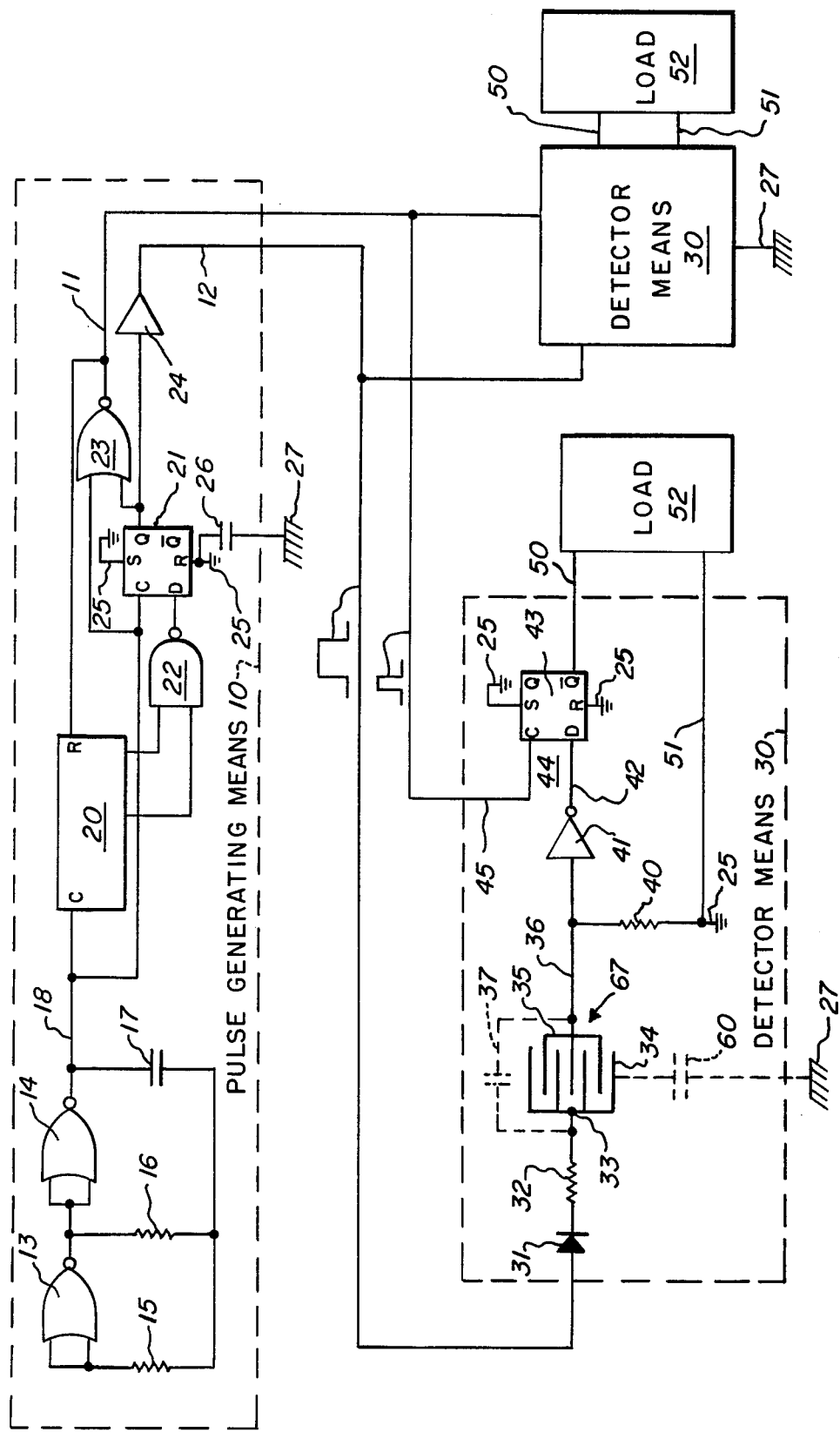
FIG. 1 is an electrical schematic of the present invention.

In FIG. 1 a schematic diagram of a digital touch actuated system is provided. The energizing circuits, power supplies and similar conventional portions have been omitted for clarity sake, and are well understood in the electrical arts.

A pulse generating means 10 is shown encompassing the top portion of the figure, and utilizes conventional digital components to make up an oscillator circuit. The pulse generating means 10 has a pair of pulse outputs 11 and 12. The pulse generating means 10 includes two NOR gates 13 and 14 that are connected through a pair of resistors 15 and 16 to a capacitor 17 so that a square wave is generated on conductor 18. The square wave is supplied to a binary ripple counter disclosed at 20 and to terminal "C" of a flip-flop 21. A NAND gate is also energized from the binary ripple counter 20 and supplies a further input to "D" of the flip-flop 21. A NOR gate 23 is also connected across the input and output of the flip-flop 21 with one input of the NOR gate common to a buffer amplifier 24 which provides the pulse output 12. The flip-flop 21 has a pair of circuit grounds 25, with the circuit ground 25 connected through a capacitor 26 to an earth ground 27.

The pulse generating means 10, which is in the form of an oscillator circuit having a digital output of pulses on 11 and 12, can be fabricated in many different ways. The present pulse generating means 10 has the pair of pulse outputs 11 and 12 as shown in FIG. 2.

Figure 2:
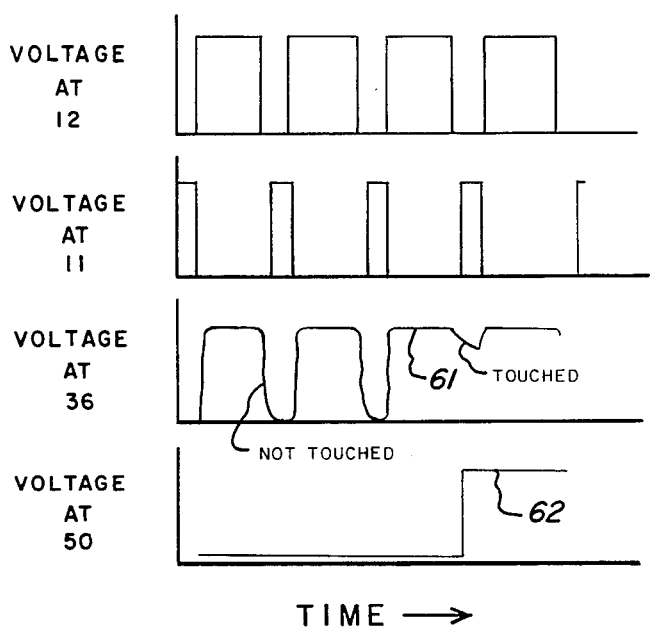
FIG. 2 is a group of wave forms in different parts of the schematic of FIG. 1.

The FIG. 2 the pulse output 12 is disclosed as the first voltage pulse with respect to time, and the pulse output 11 is shown as the second voltage wave form with respect to time. It will be noted that the pulse output 12 is substantially wider than the pulse output 11 and that the two pulse outputs are alternate in existence with respect to time. That is, the voltage of pulse output 12 occurs, and then drops to zero prior to the generation of the voltage pulse output 11. The voltage output 11 then returns to zero at the time the voltage pulse output 12 reoccurs. These two wave forms have been schematically represented in FIG. 1 as existing on the pulse outputs 11 and 12 for reference sake as a matter of convenience.

Two detector means 30 have been disclosed, and it is understood that any number of detector means can be connected in the manner in which the two specific examples have been disclosed. Only one of the detector means 30 will be described in any detail, as all of the detector means 30 would be the same and would function in the same manner.

The pulse output 12, which is the longer duration pulse, is connected through a diode 31 and a resistor 32 that make up an asymmetric conducting impedance means. The resistor 32 is connected at 33 to the first of two spaced conductor means 34. The second of the spaced conductor means 35 is connected to a conductor 36. The two spaced conductor means 34 and 35 have been disclosed as a grid-like configuration which is generally rectangular in shape. The configuration or shape of the two spaced conductor means 34 and 35 is not material to the present invention. These could be spiral in nature, or any other plain geometric pattern that is convenient as long as two spaced conductors are provided and are electrically insulated from one another. An interelectrode capacitance 37 has been disclosed which would inherently exist in this type of electrical grid construction.

The conductor 36 is connected to a bleed resistor 40 which in turn is connected to the circuit ground 25. the conductor 36 is also connected to an inverter 41 which inverts the signal input on conductor 36 to the conductor 42. The conductor 42 is connected to a second flip-flop 43 which is again connected having the circuit grounds 25. The resistor 40, the inverter 41 and the flip-flop 43 make up a pulse processing means 44 and is connected by a conductor 45 to the pulse output 11, which has been shown schematically as the shorter in time span of the pulses from the pulse generating means 10. It will thus be noted that the flip-flop 43 has two different inputs one marked "C" and the other marked "D." These two inputs are compared by the flip-flop 43, as will be explained in connection with a description of the operation of the system.

The pulse processing means 44 further includes an output conductor 50 connected to the inverted output "$\bar{Q}$" of the flip-flop 43, and conductor 51 connected to the circuit ground 25. The output conductors 50 and 51 connect to a load 52 which can be any type of electrical load which would normally include a buffer amplifier and electrical switching device which could be used to control any type of electrical equipment in response to the touch actuated detector means 30. As has been previously indicated, any number of detector means 30 and loads 52 can be connected to the pulse output 11 and 12. The inherent capacitance of an animal has been disclosed at 60, connected between the conductor 34 and the earth ground 27. The inherent capacitance 60 of an animal is required, as an essential operating element, for the touch actuated system disclosed. It should be understood that in the present invention the term animal has been very broadly used to include human beings, domestic animals and pets. The present touch actuated switch or system could be used by the application of a human's finger, an animal's paw or its nose. Any of these actuating functions would provide the two necessary elements, that is a bridging resistance between the conductors 34 and 35, along with the application of the inherent body capacitance 60 to earth ground. The present touch actuated system, therefore, would not respond to inanimate objects, electrical transient, dirt or contaminates which might short the conductors 34 and 35. The actual presence of an animal having an inherent capacitance to ground is essential, as will be understood in a description of operation of the system along with the voltage wave forms disclosed in FIG. 2.

In FIG. 2 the volatage wave form of the pair of pulse outputs 11 and 12 have been disclosed and have been previously described. A voltage output with respect to time on conductor 36 is disclosed in the third of wave forms. It will be noted that the wave form is basically the same as the pulse output 12 at the portion indicated as not being touched. This wave form is generated by the interelectrode capacitance 37 that would be present between the conductors 34 and 35. The last wave form disclosed is a voltage on conductor 50 with respect to ground, and indicates that during the period of time when the touch responsive area is not being touched that the conductor 50 has no voltage present.

Considering the wave form of voltage at conductor 36, when the touch responsive area is touched, for example a human finger, the conductors 34 and 35 are shorted together by a relatively low resistance and at the same time the voltage indicated at 61 is applied across the inherent body capacity 60. This inherent body capacity is charged by the voltage 61 and the body holds this voltage level long enough so that the voltage on conductor 36 rises and is inverted by the inverter 41 and applied to conductor 42 at the input "D" of the flip-flop 43. Due to the inverter 41, the voltage on conductor 42 is now a logic 0 or the absence of voltage. This is the inverse of the voltage that was present when the touch responsive area was untouched. The input of a voltage pulse 11 at this time provides the flip-flop 43 with a reversal of its previous output, thereby causing the conductor 50 to have a rise in voltage as disclosed at 62. This rise in voltage 62 remains as long as the touch responsive area is contacted by the finger. The load means 52 is arranged to receive the change in voltage to voltage 62 and to activate the load in any convenient manner.

It can be seen from the above discussion that the presence of an element, such as the human finger, across the conductors 34 and 35 causes the voltage on conductor 36 to change state and be inverted by the inverter 41. This inversion by inverter 41 combined with the pulse output 11 causes the flip-flop 43 to change state and activate the load 52. The mere application of a short circuit between the conductors 34 and 35 does not provide the necessary charging delay of capacitor 60 and voltage which are necessary to actuate the present system. The inherent body capacitance 60 of an animal is required.

Figure 3:
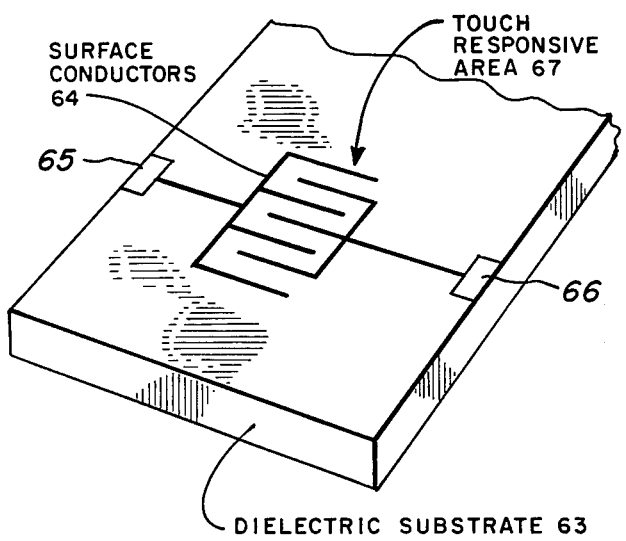
FIG. 3 is one possible way of fabricating the touch responsive area that is used in the detector circuit.

In FIG. 3 a pictorial representation of one possible switch structure or touch responsive area has been disclosed. A dielectric substrate material 63 is disclosed having surface conductors 64 deposited on the substrate surface along with a pair of pads 65 and 66 which are used for interconnection to the touch responsive area 67. The touch responsive area 67 corresponds to the grid made up of conductors 34 and 35 in FIG. 1.

A very simple, but highly reliable touch actuated system has been disclosed. A single pulse generating means 10 having two output pulses operates any number of detector means and touch responsive areas to control various loads. The exact configuration of the electronics is not material as long as the system is designed to compare two pulse outputs in a pulse processing means after one of the pulses has been fed through a touch responsive area that is made up of two spaced conductor means. Since the present invention can be carried out in many different modes and for utilization by different types of animals, the exact configuration and utilization of the present invention is left to the skill of those working in the art. The present invention should be limited only in scope by the appended claims.

The embodiments of the invention in which an exclusive property or right is claimed are defined as follows:

1. A touch actuated system that responds to the touch of an animal, including: continuous pulse generating means for generating a pair of pulse outputs; at least one touch actuated detector means connected to receive said pair of pulse outputs; said detector means including a touch responsive area having two spaced conductor means which are adapted to be connected together resistively by an animal that has an inherent capacitance to ground; said touch responsive area having a first of said spaced conductor means connected to a first of said pulse outputs through an asymmetrically conducting impedance means; said touch responsive area having a second of said spaced conductor means connected to pulse processing means; and said pulse processing means connected to a second of said pulse outputs with said pulse processing means changing state to operate a load when an animal contacts said touch responsive area to alter the resistance between said spaced conductor means concurrently with said inherent capacitance being charged.

2. A touch actuated system as described in claim 1 wherein said two spaced condutor means includes a pair of closely spaced conductors formed in a pattern to define said touch responsive area.

3. A touch actuated system as described in claim 2 wherein said pulse processing means is electronic circuit means for comparing said second pulse output means with an output from said second of said spaced conductor means.

4. A touch actuated system as described in claim 3 wherein said pair of pulse outputs are alternate pulse outputs so that in the absence of an animal contacting said touch responsive area said electronic circuit means receives said pulse outputs alternatingly and is not responsive thereto.

5. A touch actuated system as described in claim 4 wherein said pair of pulse outputs are different in time duration.

6. A touch actuated system as described in claim 5 wherein said pulse processing means includes an inverter and flip-flop circuit; and wherein said animal is a human being.

7. A touch actuated system as described in claim 2 wherein said pattern is a grid work.

8. A touch actuated system as described in claim 7 wherein said pulse outputs are alternate pulse outputs of different time duration; and said pulse processing means includes inverter and flip-flop circuit means.

9. A touch actuated system as described in claim 8 wherein said pulse processing means further includes a bleed resistor to a circuit ground; and said circuit ground is connected to earth ground by a capacitor.

10. A touch actuated system as described in claim 9 wherein said animal is a human being capable of completing contact between said two spaced conductor means and said earth ground so that the inherent capacitance of said human being is charged to control said pulse processing means to operate a load.

* * * * *